United States Patent [19]

Stewart et al.

[11] 4,129,682

[45] Dec. 12, 1978

[54] HIGH DENSITY LED LEAD FRAME

[75] Inventors: Walter P. Stewart, Palo Alto; Lawrence F. Punte, San Jose, both of Calif.

[73] Assignee: Monsanto Company, St. Louis, Mo.

[21] Appl. No.: 852,171

[22] Filed: Nov. 16, 1977

[51] Int. Cl.² .................. H01K 1/40; H01L 23/12; H01L 31/02
[52] U.S. Cl. .................................. 428/571; 428/43; 428/572
[58] Field of Search .................. 428/571, 572, 43

[56] References Cited

U.S. PATENT DOCUMENTS

| 2,584,074 | 1/1952 | Wilkins | 428/43 |
| 3,423,516 | 1/1969 | Segerson | 428/571 |
| 3,444,441 | 5/1969 | Helda et al. | 428/571 |

*Primary Examiner*—Brooks H. Hunt
*Attorney, Agent, or Firm*—Henry Croskell

[57] ABSTRACT

A high density interdigitated symmetrical separable lead frame for use in fabricating light-emitting diodes. A plurality of protection bars protects the unseparated lead frame from damage during initial handling and plating processes. The frame is separable into two unitary segments for attachment of light-emitting diode assemblies. Substantial savings are realized in material costs.

13 Claims, 3 Drawing Figures

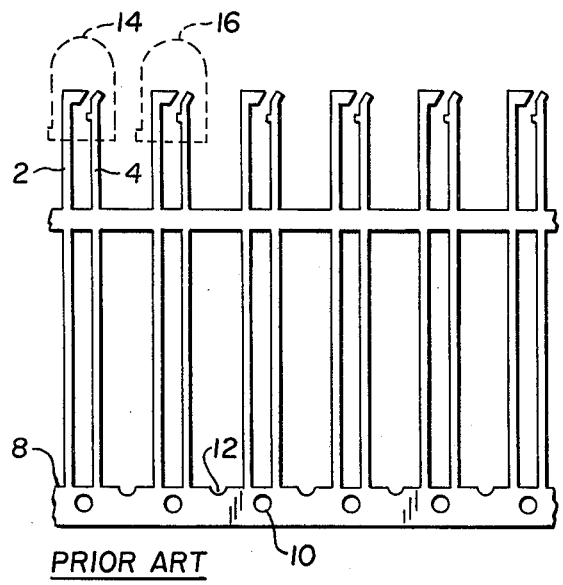
FIG._1. PRIOR ART
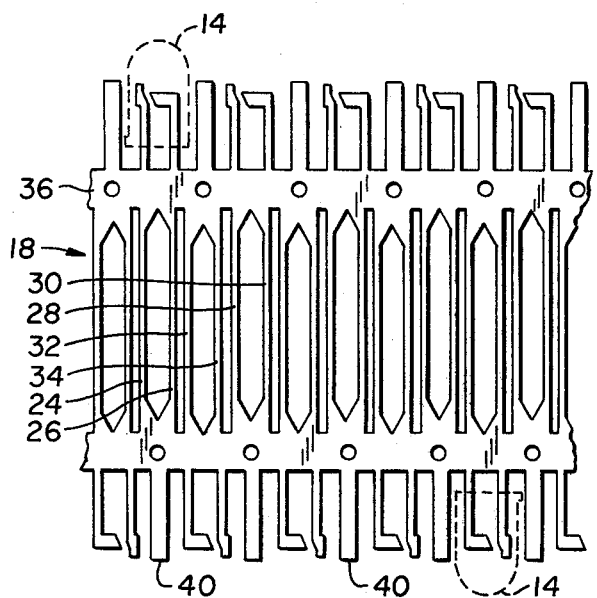
FIG._2.
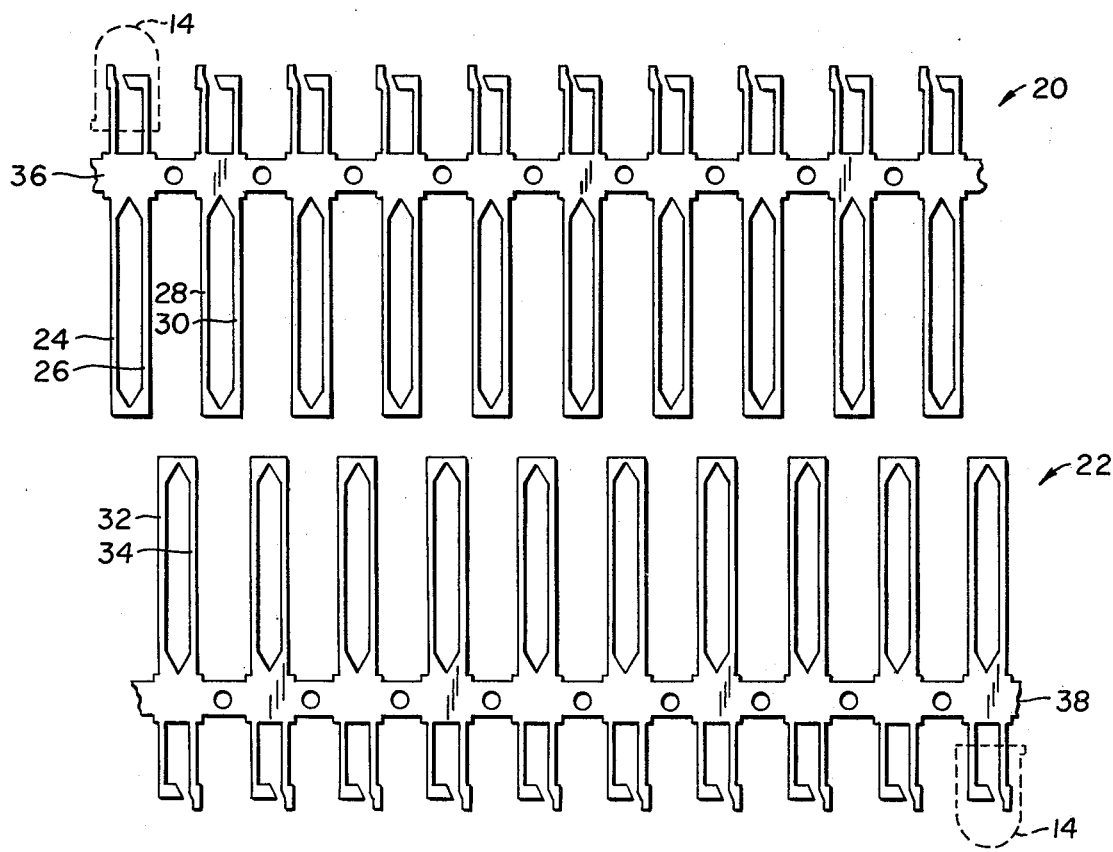
FIG._3.

HIGH DENSITY LED LEAD FRAME

BACKGROUND OF THE INVENTION

The invention relates to lead frames for the assembly of light-emitting diodes (LED's) and more particularly to a high density lead frame that is separable into two unitary lead frames suitable for use in conventional assembly processes. Lead frames are formed into elongated strips by mechanical stamping processes.

Present practices in assembling light-emitting diodes require continuous strip lead frames that have a plurality of lead pairs held by portions of the lead frame in fixed positions relative to each other so that the light-emitting diode assemblies can be easily affixed to the sets of lead pairs in a production line. Following affixation of the assemblies, the interrelating portions of the lead frame are stamped out, leaving a plurality of separate light-emitting diode assemblies and respective lead pairs.

Prior to the assembly process, lead frames may be plated by running the strips through high speed reel to reel plating baths. Present lead frame strips are often provided in large rolls of several feet in diameter and are configured to provide a flat edge strip along which the rolls can be set and against which the strips can be run in the plating bath. One problem in handling the large rolls is a "corkscrew" effect as the strips are unwound caused by residual stress introduced in the unsymmetrical pattern of the strip during the stamping process.

Lead frames are one of the most significant cost factors in the manufacture of light-emitting diodes and the present configuration of lead frames typically uses only 20%-24% of the available blank strip, resulting in substantial waste and high material and labor costs.

SUMMARY OF THE INVENTION

In accordance with the teachings of the present invention these and other shortcomings in the prior art are overcome by the provision of a high density interdigitated lead frame which is separable into two unitary lead frames. The configuration of the inventive lead frame approximately doubles the number of parts that can be stamped from a given blank size thus appreciably reducing material costs. Moreover, since twice as many parts are obtained for each index of the part through the stamping die, the running cost (labor and overhead) is essentially cut in half.

In assembly of light-emitting diodes, the lead frame of the invention retains the advantages of multiple unit assembly either in its unseparated form or as separated into two continuous frames.

Handling of the new interdigitated lead frame from rolls is facilitated by elimination of the "corkscrew" effect resulting from the residual stresses from stamping the prior art asymmetrical lead frames.

These and other advantages of the present invention will be more fully appreciated as the following description of the preferred embodiment is read and understood in connection with the drawings.

BRIEF DESCRIPTION OF THE DRAWINGS

FIG. 1 is a cut away plan view of a typical prior art lead frame.

FIG. 2 is a cut away plan view of the lead frame of the present invention in its connected form.

FIG. 3 is a cut away plan view of the lead frame of the present invention in its separated form.

DESCRIPTION OF THE PREFERRED EMBODIMENTS

FIG. 1 shows a portion of a typical prior art lead frame in the form of an elongated strip. Sets of lead pairs, such as 2 and 4, are interconnected by longitudinal bars 6 and 8. Lead frame strips are formed by stamping dies operating on blank strips of thin metal. The circular holes 10 and half-circular cut outs 12 in lower strip 8 are useful for indexing purposes in the assembly process. In assembling light-emitting diodes, the upper portion of the lead 2 provides a mounting surface for an LED dice (not shown) and a wire lead (not shown) is attached from the dice to the top of lead 4. The dice and wire are then enclosed in plastic (shown in phantom at 14 and 16). The adjacent sets of lead pairs are separated from each other only so far as to permit proper spacing of adjacent plastic domes. A further punching operation removes the connecting bars 6 and 8, leaving the LED assembly and separated leads such as 2 and 4 having a length extending nearly to the removed strip 8.

Lead frame strips are typically provided in large rolls several feet in diameter. Unbalanced shearing forces required to stamp out a configuration of the type as in FIG. 1 result in a twisting force which causes the strip to "corkscrew" as it is unrolled.

Strips such as the prior art lead frame strip of FIG. 1 utilize only in the order of 20%-24% of the area of the blank strip from which it is punched.

In order to provide a lead frame utilizing a substantially greater portion of the blank and avoiding the unbalanced shearing forces while retaining the advantage of a unitary lead frame for ease in fabrication, the high density, separable lead frame of FIGS. 2 and 3 is provided. FIG. 2 shows the inventive lead frame in its connected form and FIG. 3 shows the inventive lead frame in its separated form.

In its connected form the inventive lead frame is a unitary elongated metal strip 18 having first and second segments for separation into two identical unitary elongated strips 20 and 22 as in FIG. 3. In the connected form of FIG. 3 every second set of lead pairs is a part of a particular one of the segments, as, for example, lead pairs 24, 26 and 28, 30 are part of the upper segment 20. Adjacent sets of lead pairs are oppositely directed laterally, as, for example, the set of lead pairs 24 and 26 are directed upwardly and the adjacent set 32 and 34 are directed downwardly. However, only the lead pairs from one segment extend at each of the lateral sides of the lead frame. For example, the upper portion of leads 24, 26, 28 and 30 extend at the top side. Thus, the two segments are interdigitated and symmetrical with respect to each other. The upper longitudinal connecting bar 36 is a part of the upper segment 20, while the lower longitudinal connecting bar 38 forms a part of the lower segment 22, thus maintaining interconnection of the respective sets of lead pairs.

Optional protection bars 40 extending laterally on each side of the lead frame 18 can be provided between sets of lead pairs extending from each lateral side. Such protection bars can also be provided on only one lateral side of the lead frame 18. Protection bars 40 function to minimize contact with the extended leads to lessen the chance of damage as the lead frame strips are transported and to permit plating of the lead frame strips by high speed "reel to reel" plating processes.

As in the case of the prior art lead frame of FIG. 1, LED dice and wires (not shown) are connected to the extended lead pairs and enclosed in plastic 14. The longitudinal spacing between adjacent extending lead pair sets or between extending lead pair sets is minimized while permitting sufficient space to enclose the disc and wires in plastic prior to punching the lead frame into individual pieces.

In assembly operations the inventive lead frame may be used in the connected form of FIG. 2 or punched into the separate pieces of FIG. 3. In punching frame 18 into two pieces, the protection bars 40 are punched out, allowing slightly larger plastic domes on frames 20 and 22.

Circular holes 40 in the frames are useful for indexing purposes in the LED assembly process.

Typically the frame 18 is stamped from blanks of a suitable metal or metal alloy having a relatively constant thickness between about 10 to 50 mils. Suitable metals and metal alloys include copper and copper alloys, nickel and nickel alloys, alloys of iron and steel and aluminum and aluminum alloys. Copper-silver alloy is frequently used in the industry for lead frames. Following the stamping operation to produce the configuration of FIG. 2, the lead frame strips are plated with a further metal by dipping into a plating tank.

Variations and modifications of the present invention may be apparent to those of ordinary skill in the art. The invention is therefore to be limited only by the scope of the appended claims.

We claim:

1. A high density separable lead frame for light-emitting diodes comprising
   a unitary one piece elongated metal strip having a substantially uniform thickness, said strip including first and second segments separable into two unitary strips, each of said strips having a plurality of lead pairs.

2. The combination of claim 1 wherein every second set of lead pairs is part of a particular one of said segments.

3. The combination of claim 2 wherein each adjacent set of lead pairs is oppositely directed laterally.

4. The combination of claim 2 further comprising a plurality of protection bars, each extending laterally between adjacent sets of lead pairs, said bars extending beyond the lateral extension of said lead pairs, whereby said lead pairs are less susceptible to damage.

5. The combination of claim 3 further comprising a plurality of protection bars, each extending laterally between adjacent sets of lead pairs, said bars extending beyond the lateral extension of said lead pairs, whereby said lead pairs are less susceptible to damage.

6. The combination of claim 3 wherein the sets of lead pairs for each of said segments extend laterally from opposite sides of said strip.

7. The combination of claim 6 wherein the spacing between adjacent extending sets of lead pairs on each side of said strip is minimized yet permitting the attachment of a light-emitting diode assembly at each set of lead pairs prior to separation of the lead frame into individual pieces.

8. The combination of claim 6 wherein said two segments are interdigitated and symmetrical with respect to each other.

9. The combination of claim 1 wherein said elongated metal strip is stamped.

10. The combination of claim 1 wherein said elongated metal strip is fabricated from metals and metal alloys selected from the group of copper and copper alloys, nickel and nickel alloys, aluminum and aluminum alloys and alloys of iron and steel.

11. The combination of claim 1 wherein said elongated metal strip has a thickness between about 10 and 50 mils.

12. The combination of claim 10 wherein said elongated metal strip is plated.

13. The combination of claim 1 wherein said segments are separable by stamping.

* * * * *